United States Patent [19]

Stout

[11] Patent Number: 4,927,733

[45] Date of Patent: May 22, 1990

[54] CONFORMATION OF VACUUM-LAMINATED SOLDER MASK COATED PRINTED CIRCUIT BOARDS BY FLUID PRESSURIZING

[75] Inventor: Gary K. Stout, Gloucester, N.J.

[73] Assignee: E. I. du Pont de Nemours and Company, Wilmington, Del.

[21] Appl. No.: 288,915

[22] Filed: Dec. 23, 1988

[51] Int. Cl.$^5$ .............................................. G03C 1/74
[52] U.S. Cl. ................................. 430/256; 430/270; 430/935; 156/87; 156/286; 156/285; 156/382; 156/381

[58] Field of Search ................. 430/935, 256, 270; 156/87, 286, 285, 382, 381

[56] References Cited

U.S. PATENT DOCUMENTS 4,127,436  11/1978  Friel ..................................... 156/630

Primary Examiner—Paul R. Michl
Assistant Examiner—Thorl Chea

[57] ABSTRACT

A method is disclosed of obtaining a void free interface between a photosensitive dry film and substrate by applying uniform fluid pressure after vacuum lamination.

18 Claims, No Drawings

CONFORMATION OF VACUUM - LAMINATED SOLDER MASK COATED PRINTED CIRCUIT BOARDS BY FLUID PRESSURIZING

BACKGROUND OF THE INVENTION

The present invention is directed to a method of obtaining a substantially void free interface between a substrate surface having a raised relief and a photopolymerizable dry film applied thereto. More specifically the present invention is particularly adapted to application of a solder mask in manufacture of a printed circuit board.

Friel U.S. Pat. No. 4,127,436 discloses a process for applying under a vacuum a photoresist-forming layer to a substrate surface wherein it is stated that a laminate without entrapped air bubbles is formed.

Oizuma U.S. Pat. No. 4,388,129 discloses a method for impregnating a porous fibrous substrate with a solvent-free liquid resin, allowing substantially all entrapped air bubbles to disappear and curing the combination. The air bubbles can be eliminated by allowing the impregnated article to stand for a sufficient period of time which may be shortened by applying ultrasonic waves, by placing the green laminate in compressed air or by using degassed liquid resin.

SUMMARY OF THE INVENTION

The present invention is directed to a method of obtaining a substantially void free interface between a light sensitive dry film and a substrate having a raised relief comprising the steps of (a) vacuum laminating the dry film onto the substrate to form a laminate whereby voids are entrapped in a substrate surface-film interface between the dry film and the substrate upon release of the vacuum in the vacuum lamination; (b) applying uniform elevated pressure of at least 0.3 atmospheres above ambient to the laminate by a pressurized fluid whereby voids entrapped in the substrate surface film interface are eliminated; and (c) releasing the uniform elevated pressure.

DETAILED DESCRIPTION OF THE INVENTION

The present invention is considered to be an improved method over the process disclosed in Friel U.S. Pat. No. 4,127,436 which is incorporated by reference herein. Accordingly various portions of the patent are reproduced herein.

Friel discloses a process applying a photoresist-forming layer to a surface having raised areas comprising:

(1) positioning the surface of a solid, unexposed, photoresist-forming layer adjacent to a surface having raised areas, while the other surface of the layer has adhered thereto with low-to-moderate adherence a thin, flexible, polymeric film support, (2) reducing the absolute gas pressure to less than one atmosphere in the region between the surface having raised areas and the surface of the layer, and (3) applying pressure to the entire surface of the film support at once over the area of the layer adjacent to the surface having raised areas, whereby the photoresist-forming layer is forced into intimate contact with the surface having raised areas.

As set forth in this patent additional process steps are employed, namely, in either order steps (4) and (5) followed by step (6).

(4) exposing the layer, imagewise, to actinic radiation, (5) stripping the film support from the resulting image-bearing layer, and (6) removing areas of the layer imageWise to form a resist image on the surface having raised areas.

Other process steps may be employed such as an additional step of permanently modifying the adjacent areas on said surface which are unprotected by the resist image by treating with a reagent capable of etching said areas or depositing a material on said areas.

The photoresist-forming layer, conventionally referred to as "dry film resist," is a layer of photosensitive material from which a resist image may be produced after imagewise exposure to actinic radiation by removal of areas of the layer. In the case of a negative-working material, the unexposed areas are removed and the exposed areas remain as the resist image. In the case of positive-working materials, the unexposed areas form the resist image. These materials of which the photoresist-forming layer is formed are much weaker than the film support on which they are coated and when applied at elevated temperatures become very soft and tacky. The two-layer structure of the film support and photoresist-forming layer is conventionally required for application of the photoresist-forming layer using a vacuum lamination technique. The film support enables the photoresist-forming layer to be held apart from the surface having raised areas, if desired, and acts as a pressure-transmitting member to force the soft, tacky layer into conformation with the raised areas. It is considered that the term "photosensitive dry film" is inclusive of other layers such as a subbing layer which is not photosensitive.

In the present invention it is considered that the prior art vacuum lamination processes, as exemplified by the Friel process, while generally useful in excluding air from laminate structures are still unsatisfactory in certain instances where microbubbles or voids are entrapped at the interface between the substrate and the laminated photopolymerizable film. In the production of printed circuit boards and in the use of liquid/dry film as a solder mask on a substrate surface having a raised circuit relief, the presence of microbubbles or voids becomes critical when the spacing between the raised circuit conducting areas decreases such as with high density circuit boards. When the dimensions of the microbubbles or voids become significant in relationship to the intervening dielectric surface between adjacent conductive circuit lines, the electrical characteristics of the circuit are typically affected leading in some instances to poor mask adhesion and to electrical shorts during the soldering process. In the present invention it has been found that microbubbles or voids present in such high density circuit laminates can be eliminated permanently by immersing the laminate in a pressurized fluid, e.g., compressed air, for a short duration. Not only are the microbubbles or voids eliminated, but they do not reappear when the laminate is removed from the pressurized fluid even upon standing or further processing. In effect immersion in a pressurized fluid applies a uniform pressure to all areas and in all directions to the immersed laminate without adversely affecting the physical and exposure characteristics of the photopolymerizable circuit laminate.

Typically in the practice of this invention, the laminated structure after the vacuum lamination is exposed to a fluid pressure at least about 0.3 atmospheres and preferably at least about 3 atmospheres above ambient for a duration of about 1 minute or more typically between 1 minute and about 10 minutes. This process may take place in the vacuum lamination chamber or in a separate pressure chamber. Although the preferred fluid is air or nitrogen, liquids such as water or inert organic materials or solutions thereof may be used. The fluid pressurization conditions may be adjusted in several ways to insure bubble or void free printed circuit laminates. For laminated solder masks, laminates typically are rendered bubble or void free by pressurizing in air at room temperature, e.g., 25 to 30° C., at about 5 to 6 atmospheres (i.e., about 74 to 88 psi) above ambient for about 1 minute. By increasing the laminate temperature, the time duration needed to produce bubble or void free laminates can be reduced below 1 minute or the fluid pressure needed can be reduced. Alternately, the time needed to produce bubble free laminates may be increased beyond 1 minute by reducing the fluid pressure applied, e.g., down to about 0.3 atmospheres (about 5 psi) above ambient, and/or the laminate temperatures below room temperature. The actual conditions used may be chosen to accommodate the specific method used to pressurize the laminate structure and insure the integrity of the bubble free laminate before imaging exposure.

The photoresist-forming layer is thermoplastic and is preferably laminated at an elevated temperature at or above the stick temperature of the layer, which is the lowest temperature at which the layer will form a firm bond with and conform to the surface having raised areas. Commercial photoresist materials usually have a stick temperature in excess of 40° C. With some preferred materials the temperature of the surface employed during lamination is 100° C. or more. The stick temperature of various materials may be lowered (e.g., to or below room temperature) by addition of excess monomer or plasticizer. It is usually desired, however, that the layer become soft and tacky when heated above room temperature. It is preferred to heat the surface having raised areas to provide the elevated temperature for lamination.

The dry film resists useful in the process of this invention typically have a solid photohardenable or photopolymerizable layer, such as those disclosed in Celeste U.S. Pat. No. 3,469,982, having as essential components a solid preformed polymeric or macromolecular binder, an ethylenically unsaturated compound or monomer capable of free-radical addition polymerization, and a free-radical initiating system activatable by actinic radiation. Such layers typically have additional components to improve end use characteristics such as thermal inhibitors, dyes, pigments, fillers and the like. Examples of such dry film soldermask resists are contained in Gervay et al U.S. Pat. No. 4,278,752, Gervay U.S. Pat. No. 4,621,043 and Tecle European patent application No. 87113013.4. Also positive working films can be employed such as disclosed in Cohen U.S. Pat. No. 4,193,797.

These materials may be coated as a layer on a polymeric film support to form a photosensitive resist-forming element. This type of element has conventionally been laminated with pressure rolls or the like to a surface to be modified. When the surface has raised areas, however, small bubbles tend to form at the edges of the raised areas, particularly where there is an angular joint between the surface and the side walls of the raised areas thereon. After development of the resist image and upon use thereof for modification of the unprotected areas of the surface, e.g., by etching, soldering, etc. the material being used to modify the surface, e.g., acid, solder, etc., may get under the resist in the areas where there are bubbles and modify the surface where it is supposed to be protected. In addition, the pressure rolls can fracture the resist between the raised areas and the rolls. The prior art processes apply photoresist-forming layers to surfaces having raised areas in which the layer is applied to the surface having raised areas under vacuum. The layer is positioned adjacent to the surface. The layer may be in direct contact with the surface or it may be held apart, i.e., substantially out of contact, therefrom while the area therebetween is evacuated. After evacuation, the two are forced into intimate contact. The force for application of the layer to the surface is applied to the entire surface of the film support at once by a gas pressure difference between the side of the layer adjacent to the surface having raised areas and an area on the side of the layer bearing the polymeric film support. The latter area may be bounded by the film support itself or by a resilient member, such as polymeric sheet (e.g., rubber), in contact with the film support. The pressure is reduced below atmospheric on the side of the layer bearing the film support and on the side adjacent to the surface having raised areas. The area on the film support side is then vented to the atmosphere, increasing the pressure on that side and forcing the photoresist-forming layer into intimate contact with the surface having raised areas, so that the photoresist-forming layer conforms to the raised areas and forms a firm bond with the surface.

In addition to enabling the application of a protective layer, the photoresist forming layer is applied with substantially uniform overall force normal to an entire surface at once so that the layer is not extruded across the surface, with non-uniformities in the flow due to the raised areas. The flexible film support, under the force of gas pressure directly or from a resilient member, presses the photoresist-forming layer down in conformation with the raised areas on the surface. In the case where a resilient member presses against the adherent film support of the layer, said member should have a resilience such that under the force of application its surface will conform to that of the flexible film support and layer in contact with the surface having raised areas. A rubber sheet is suitable for this purpose.

The thin, flexible, polymeric film support adhered to one surface of the photoresist-forming layer, which is in any case required for the manufacture, storage and use of the layer, may serve as the element maintaining a gas pressure for lamination and as a flexible pressure member to force the layer into conformation with the raised areas on the surface. In an apparatus having a resilient member for maintaining a gas pressure difference or for providing a pressure member for forcing the photoresist-forming layer into conformation with the surface having raised areas, the film support prevents the layer from sticking to the resilient member or other part of the apparatus. A suitable support film which preferably has a high degree of dimensional stability to temperature changes, may be chosen from a wide variety of films composed of high polymers, e.g., polyamides, polyolefins, polyesters, vinyl polymers, and cellulose esters, preferably having a thickness of from 0.00025 inch to 0.008 inch or more. If exposure is to be made before removing the support film, it must, of course, transmit a substantial fraction of the actinic radiation incident upon it. If the support film is removed prior to exposure, no such restrictions apply. A particularly suitable film is a transparent polyethylene terephthalate film having a thickness of about 0.001 inch. Suitable removable cover films, which are removed prior to practicing the process and which protect the surface of the layer, may be chosen from the same group of high polymer films described above and may have the same wide range of thickness. A cover film of 0.001 inch thick polyethylene is especially suitable. Support and cover films as described above provide good protection to the photopolymerizable resist layer.

The process is preferably practiced by positioning a photoresist-forming layer adjacent to the surface having raised areas and reducing the gas pressure between the layer and surface below atmospheric pressure in a device which is divided into two chambers by a resilient member. The pressure is then increased, e.g., by venting to the atmosphere, on one side of the member, thereby forcing the layer and the surface firmly together. This process is commercially practiced, e.g. using Du Pont Model SMUL-300 vacuum laminator.

In the present invention it is considered that the prior art process of vacuum lamination is unsatisfactory in certain instances since a void free interface between the substrate and vacuum laminated dry film is not obtained. In production of printed circuit boards and in use of the dry film as a solder mask on a substrate surface having a raised relief, the spacing between raised portions and portions which are not raised decreases, i.e. spacing between dielectric areas and conducting areas. Particularly with a relief which has a relatively high level, the reduced spacing between peaks and valleys plus added requirements in the dry film to obtain adherence to the substrate make it difficult to avoid any voids during conventional vacuum lamination.

As discussed earlier in the present invention it is necessary to apply a uniform fluid pressure above ambient atmospheric pressure uniformly to the entire vacuum laminated circuit board structure. The elevated pressure which is necessary to be applied by a pressurized liquid or gaseous fluid allows uniformity in all areas and directions to the dry film laminate structure. Typically, the laminated structure after exiting the vacuum laminator is then placed in a pressure chamber and the fluid pressure of the chamber raised to at least about 0.3 atmospheres and preferably at least about 3 atmospheres above ambient for a duration of about 1 minute or more. Although the preferred fluid is air or nitrogen liquids such as water or inert organic materials may be used. The fluid pressurization conditions may be adjusted in several ways to insure void free printed circuit laminates. For vacuum laminated conventional dry film solder masks, laminates typically are rendered void free by pressurizing in air at room temperature, e.g. 25 to 30° C., at about 5 to 6 atmospheres (i.e. about 74 to 88 psi) above ambient for about 1 minute. By increasing the laminate temperature, the time duration needed to produce void free laminates can be reduced below 1 minute or the fluid pressure needed can be reduced. Alternately, the time needed to produce void free laminates may be increased beyond 1 minute by reducing the fluid pressure applied, e.g., down to about 0.3 atmospheres (about 5 psi) above ambient, and/or the laminate temperature below room temperature. The actual conditions used may be chosen to accommodate the specific method used to pressurize the laminate structure and insure the integrity of the void free laminate before imaging exposure. Fluid pressurization may be carried out in a batch process wherein a number of vacuum laminated structures are placed in a chamber and fluid pressure raised, or it may be carried out in a sequential, in-line process wherein each laminate after it exits the vacuum laminator, enters a fluid pressurization chamber for a duration needed to insure void-free laminates.

The backing layer is well known and is conventionally present in the vacuum lamination procedure.

A negative working photosensitive formulation is preferred and it will contain a preformed polymeric binder. Suitable binders which can be used alone, if employed, or in combination with one another include the following: polyacrylate and alpha-alkyl polyacrylate esters, e.g., polymethyl methacrylate and polyethyl methacrylate; polyvinyl esters, e.g., polyvinyl acetate, polyvinyl acetate/acrylate, polyvinyl acetate/methacrylate and hydrolyzed polyvinyl acetate; ethylene/vinyl acetate copolymers; polystyrene polymers and copolymers, e.g., with maleic anhydride and esters; vinylidene chloride copolymers, e.g., vinylidene chloride/acrylonitrile; vinylidene chloride/methacrylate and vinylidene chloride/vinyl acetate copolymers; polyvinyl chloride and copolymers, e.g., polyvinyl chloride/acetate; saturated and unsaturated polyurethanes; synthetic rubbers, e.g., butadiene/acrylonitrile, acrylonitrile/butadiene/styrene, methacrylate/acrylonitrile/butadiene/styrene copolymers, 2-chloro-butadiene-1,3 polymers, chlorinated rubber, and styrene/butadiene/styrene, styrene/isoprene/styrene block copolymers; high molecular weight polyethylene oxides of polyglycols having average molecular weights from about 4,000 to 1,000,000; epoxides, e.g., epoxides containing acrylate or methacrylate groups; copolyesters, e.g., those prepared from the reaction product of a polymethylene glycol of the formula $HO(CH_2)_nOH$, where n is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids; nylons or polyamides, e.g., N-methoxymethyl polyhexamethylene adipamide; cellulose esters, e.g., cellulose acetate, cellulose acetate succinate and cellulose acetate butyrate; cellulose ethers, e.g., methyl cellulose, ethyl cellulose and benzyl cellulose; polycarbonates; polyvinyl acetal, e.g., polyvinyl butyral, polyvinyl formal; polyformaldehydes.

In the case where aqueous development (in comparison to solvent development) of the photosensitive composition is desirable the binder should contain sufficient acidic or other groups to render the composition processible in aqueous developer. Useful aqueous-processible binders include those disclosed in U.S. Pat. No. 3,458,311 and in U.S. Pat. No. 4,273,857. Useful amphoteric polymers which are aqueous processible include interpolymers derived from N-alkylacrylamides or methacrylamides, acidic film-forming comonomer and an alkyl or hydroxyalkyl acrylate such as those disclosed in U.S. Pat. No. 4,293,635. In development the photosensitive layer will be removed in portions which are not exposed to radiation but will be substantially unaffected during development by a liquid such as wholly aqueous solutions containing 1% sodium carbonate by weight. Illustratively a liquid or solution at a temperature of 40° C. during a time period of five minutes will remove areas of the composition which have not been exposed to actinic radiation but will not remove exposed areas.

Suitable monomers which can be used as the sole monomer or in combination with others include the following: t-butyl acrylate, 1,5-pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, pentaerythritol triacrylate, polyoxyethylated trimethylolpropane triacrylate and trimethacrylate and similar compounds as disclosed in U.S. Pat. No. 3,380,831, 2,2-di(p-hydroxyphenyl)propane diacrylate, pentaerythritol tetraacrylate, 2,2-di-(p-hydroxyphenyl)-propane dimethacrylate, triethylene glycol diacrylate, polyoxyethyl-2,2-di-(p-hydroxyphenyl)-propane dimethacrylate, di-(3-methacryloxy-2-hydroxypropyl) ether of bisphenol-A, di-(2-methacryloxyethyl) ether of bisphenol-A, di-(3-acryloxy-2-hydroxypropyl) ether of bisphenol-A, di-(2-acryloxyethyl) ether of bisphenol-A, di-(3-methacryloxy-2-hydroxypropyl) ether of tetrachloro-bisphenol-A, di-(2-methacryl-oxyethyl) ether of tetrachloro-bisphenol-A, di-(3-methacryloxy-2-hydroxypropyl) ether of tetrabromo-bisphenol-A, di-(2-methacryloxyethyl) ether of tetrabromo-bisphenol-A, di-(3-methacryloxy-2-hydroxypropyl) ether of 1,4-butanediol, di-(3-methacryloxy-2-hydroxypropyl) ether of diphenolic acid, triethylene glycol dimethacrylate, polyoxypropyltrimethylol propane triacrylate (462), ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, diallyl fumarate, styrene, 1,4-benzenediol dimethacrylate, 1,4-diisopropenyl benzene, and 1,3,5-triisopropenyl benzene.

A class of monomers are an alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of addition polymerizable ethylenic linkages particularly when present as terminal linkages. Especially preferred are those wherein at least one and preferably most of such linkages are conjugated with a double bonded carbon, including carbon double bonded to carbon and to such heteroatoms as nitrogen, oxygen and sulfur. Outstanding are such materials wherein the ethylenically unsaturated groups, especially the vinylidene groups, are conjugated with ester or amide structures.

Preferred free radical-generating addition polymerization initiators activatable by actinic light and thermally inactive at and below 185° C. include the substituted or unsubstituted polynuclear quinones which are compounds having two intracyclic carbon atoms in a conjugated carbocyclic ring system, e.g., 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2-3-diphenylanthraquinone, sodium salt of anthraquinone alpha-sulfonic acid, 3-chloro-2-methylanthraquinone, retenequinone, 7,8,9,10-tetrahydro-naphthacenequinone, and 1,2,3,4-tetrahydrobenz(a)-anthracene-7,12-dione. Other photoinitiators which are also useful, even though some may be thermally active at temperatures as low as 85° C., are described in U.S. Pat. No. 2,760,863 and include vicinal ketaldonyl alcohols, such as benzoin, pivaloin, acyloin ethers, e.g., benzoin methyl and ethyl ethers; α-hydrocarbon-substituted aromatic acyloins, including a-methylbenzoin, α-allylbenzoin and α-phenylbenzoin. Photoreducible dyes and reducing agents disclosed in U.S. Pat. Nos.: 2,850,445; 2,875,047; 3,097,096; 3,074,974; 3,097,097; and 3,145,104 as well as dyes of the phenazine, oxazine, and quinone classes; Michler's ketone, benzophenone, 2,4,5-triphenyl-imidazolyl dimers with hydrogen donors, and mixtures thereof as described in U.S. Pat. Nos.: 3,427,161; 3,479,185; and 3,549,367 can be used as initiators. Similarly the cyclohexadienone compounds of U.S. Pat. No. 4,341,860 are useful as initiators. Also useful with photoinitiators and photoinhibitors are sensitizers disclosed in U.S. Pat. No. 4,162,162.

Thermal polymerization inhibitors that can be used in the photopolymerizable compositions are: p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl-p-cresol, phenothiazine, pyridine, nitrobenzene and dinitrobenzene, p-toluquinone and chloranil. Also useful for thermal polymerization inhibitors are the nitroso compositions disclosed in U.S. Pat. No. 4,168,982.

Various dyes and pigments may be added to increase the visibility of the resist image. Any colorant used, however, should preferably be transparent to the actinic radiation used.

On the basis of monomer, initiating system and binder, these components will conventionally be present in an amount of weight of 20 to 40 parts monomer, 0.01 to 10.0 parts initiating system and 10 to 90 parts binder. More generally will be present 25 to 35 parts monomer, 4.0 to 8.0 parts initiating system and 40 to 70 parts binder. Typically the particles will be present in an amount from 10 to 45 parts by weight and more preferred 25 to 35 parts. Lower and higher ratios can be employed provided the results disclosed herein are obtained.

While the fluid pressurization process of this invention has been described in the context of conventional vacuum lamination, it is equally useful to eliminate microbubbles or voids which are entrapped during conventional lamination of dry film photoresist to copper clad substrate material or other such substrate material used for producing electrically conductive circuit boards or devices. Illustrative of such conventional lamination processes is that disclosed in Celeste U.S. Pat. No. 3,469,982 as well as those wherein dry film lamination is assisted with a liquid interface such as water or liquids such as disclosed in Fickes U.S. Pat. No. 4,069,076. Typical of the substrate materials for which this invention is useful, are those coarse weave fiber glass, epoxy substrates wherein the copper-clad surface has the regular low relief of the weave as well as those copper clad substrates which are abrasively cleaned or scrubbed prior to lamination.

To further illustrate the present invention the following example is provided.

Using Vacrel Type 8100 dry film soldermask, printed circuit boards with three dimensional circuitry having a raised relief height of about 3.5 mils were laminated in the standard solder mask vacuum laminator, i.e., SMUL-300 at a temperature of 150° to 160° F., vacuum pressure of 0-6 bars. Panels were then examined and found to have encapsulation voids in some areas between circuit traces that are closely spaced and aside of the high circuit traces where film does not flow sufficiently. These voids were caused by the inability of the dry film to flow down over the circuit heights to the board substrate. To eliminate these encapsulation voids, the laminated panels were placed in a pressurization chamber at room temperature about 25° C. The chamber was pressurized using air at 80 psi (about 5.4 atmospheres above ambient) for a one minute time period. Through an observation window in the pressure chamber, it was observed that the increased pressure extrudes the Vacrel dry film with the cover sheet in place to encapsulate the circuitry and eliminate the voids.

This example was repeated except before the pressurization step the Mylar® polyester cover sheet was removed. Again a void free interface was obtained. The removal of the cover sheet prior to pressurization was considered preferable in those instances where a cover sheet was not necessary for subsequent imaging exposure.

What is claimed is:

1. A method of obtaining a substantially void free interface between a light sensitive dry film on a substrate having a raised relief comprising the steps of:
    (a) vacuum laminating the light sensitive dry film onto the substrate;
    (b) releasing the vacuum to obtain at ambient pressure a laminate of the photosensitive film on the substrate whereby voids are present at an interface between the substrate and the laminated film;
    (c) applying uniform elevated pressure of at least 0.3 atmospheres above ambient to the entire substrate with the dry film laminate by a pressurized fluid whereby voids entrapped in the substrate surface-dry film interface are eliminated; and
    (d) releasing the uniform elevated pressure.

2. The method of claim 1 wherein the elevated pressure is at least 3 atmospheres above ambient.
3. The method of claim 1 wherein a pressurized chamber is employed which surrounds the substrate.
4. The method of claim 1 wherein the fluid is a gas.
5. A method of claim 4 wherein the gas is air.
6. A method of claim 1 wherein the fluid is a liquid.
7. A method of claim 6 wherein the liquid is water.
8. The method of claim 1 wherein the pressurized fluid is applied at ambient temperature.
9. The method of claim 1 wherein the pressurized fluid is applied for a duration of about 1 minute or less.
10. The method of claim 1 wherein the pressurized fluid is applied for a duration between about 1 minute and about 10 minutes.
11. The method of claim 1 wherein the dry film is imagewise exposed to actinic radiation.
12. The method of claim 1 wherein the dry film is photopolymerizable.
13. A method of claim 1 wherein the photosensitive dry film comprises a photosensitive layer having a backing layer releasedly adhered thereto.
14. A method of claim 12 wherein the photosensitive layer is photopolymerizable.
15. A method of claim 12 wherein the photosensitive layer is comprised of two or more component layers wherein at least one of the component layers is photosensitive.
16. A method of obtaining a substantially void free interface between a light sensitive dry film and a substrate comprising the steps of:
    (a) laminating the light sensitive dry film onto the substrate to form a laminate whereby voids or bubbles are entrapped in a substrate surface film interface formed between the dry film and the substrate;
    (b) applying uniform elevated pressure of at least 0.3 atmospheres above ambient to the entire substrate with the dry film laminate by a pressurized fluid whereby voids or bubbles entrapped in the substrate surface-film interface are eliminated; and
    (c) releasing the uniform elevated pressure.
17. A method of claim 11 wherein the substrate surface has a raised relief or a depression or a combination thereof.
18. A method of claim 11 wherein a liquid is present on the substrate during the laminating step.

* * * * *